United States Patent
Yoshida

(10) Patent No.: US 7,787,842 B2
(45) Date of Patent: Aug. 31, 2010

(54) RADIO BROADCAST RECEIVER, AUTOMATIC TUNING DEVICE FOR RADIO BROADCAST AND METHOD FOR RECEIVING RADIO BROADCAST

(75) Inventor: Makoto Yoshida, Obu (JP)

(73) Assignee: DENSO CORPORATION, Kariya (JP)

( * ) Notice: Subject to any disclaimer, the term of this patent is extended or adjusted under 35 U.S.C. 154(b) by 562 days.

(21) Appl. No.: 11/808,945

(22) Filed: Jun. 14, 2007

(65) Prior Publication Data

US 2008/0045167 A1 Feb. 21, 2008

(30) Foreign Application Priority Data

Jul. 7, 2006 (JP) .............................. 2006-188058

(51) Int. Cl.
*H04B 1/18* (2006.01)
(52) U.S. Cl. ............... 455/161.1; 455/161.3; 455/164.1
(58) Field of Classification Search ............... 455/161.1, 455/161.2, 161.3, 164.1, 164.2, 182.1, 182.2, 455/192.1, 192.2
See application file for complete search history.

(56) References Cited

U.S. PATENT DOCUMENTS

| | | | | |
|---|---|---|---|---|
| 4,207,530 A * | 6/1980 | Gallagher | ................ | 455/174.1 |
| 5,014,348 A * | 5/1991 | Boone et al. | ............. | 455/165.1 |
| 5,125,105 A * | 6/1992 | Kennedy et al. | ......... | 455/164.1 |
| 5,199,109 A * | 3/1993 | Baker | ....................... | 455/161.2 |
| 5,222,255 A * | 6/1993 | Kuo et al. | .................... | 455/266 |
| 5,555,451 A * | 9/1996 | Kennedy et al. | ......... | 455/161.2 |
| 5,613,230 A * | 3/1997 | Gottfried et al. | ......... | 455/161.3 |
| 5,621,767 A * | 4/1997 | Brandt et al. | ................ | 375/344 |
| 6,067,332 A * | 5/2000 | Taura et al. | .................. | 375/344 |
| 6,405,024 B1 * | 6/2002 | Goetz et al. | ................. | 455/260 |
| 7,308,235 B2 * | 12/2007 | Suto | ........................ | 455/161.3 |
| 7,343,143 B2 * | 3/2008 | Gamou | .................... | 455/226.1 |
| 7,570,924 B2 * | 8/2009 | Suda et al. | ..................... | 455/76 |
| 7,605,838 B2 * | 10/2009 | Lee | ............................. | 348/21 |
| 2002/0008787 A1 * | 1/2002 | Kurihara | ..................... | 348/731 |
| 2003/0224749 A1 * | 12/2003 | Uozumi et al. | ........... | 455/252.1 |
| 2005/0101273 A1 * | 5/2005 | Suto | ........................ | 455/179.1 |
| 2007/0287398 A1 * | 12/2007 | Mino | ........................ | 455/214 |

FOREIGN PATENT DOCUMENTS

| | | |
|---|---|---|
| JP | A-2004-312563 | 11/2004 |
| JP | A-2005-012593 | 1/2005 |
| JP | A-11-068519 | 3/2005 |
| JP | A-2005-191850 | 7/2005 |

* cited by examiner

*Primary Examiner*—Duc M Nguyen
(74) *Attorney, Agent, or Firm*—Posz Law Group, PLC

(57) ABSTRACT

A radio broadcast receiver includes: a frequency conversion circuit for receiving a radio broadcast wave and for outputting a reception signal; a detection circuit for detecting the reception signal of an analog radio broadcast wave and for outputting a detection signal; an automatic tuning device for searching a broadcast frequency; and a noise amplifier for amplifying a noise component in the detection signal and for outputting a noise detection signal. The automatic tuning device selects the broadcast frequency when the reception signal level is equal to or larger than a predetermined electric field intensity threshold value and a noise detection signal level is equal to or smaller than a predetermined noise determination threshold value.

15 Claims, 3 Drawing Sheets

RADIO BROADCAST RECEIVER, AUTOMATIC TUNING DEVICE FOR RADIO BROADCAST AND METHOD FOR RECEIVING RADIO BROADCAST

CROSS REFERENCE TO RELATED APPLICATION

This application is based on Japanese Patent Application No. 2006-188058 filed on Jul. 7, 2006, the disclosure of which is incorporated herein by reference.

FIELD OF THE INVENTION

The present invention relates to a radio broadcast receiver, an automatic tuning device for radio broadcast, and a method for receiving radio broadcast.

BACKGROUND OF THE INVENTION

Recently, radio broadcast is digitalized in response to digitalization of TV broadcast. For example, digitalized terrestrial radio broadcast and digitalized satellite radio broadcast start to provide service. The digitalized satellite radio broadcast is charged. However, terrestrial HD (i.e., high definition) radio broadcast becomes common in US, and it is not charged. Here, the terrestrial HD radio broadcast has commercial messages. Thus, expansion of market in the digitalized radio broadcast is expected.

The HD radio broadcast uses an in-band on-channel (i.e., IBOC) system for adding an electric wave of a digital signal to another electric wave of an analog signal. Specifically, the digitalized radio broadcast is added to conventional analog radio broadcast. Thus, an analog radio receiver can receive the analog radio broadcast, and further, a HD radio receiver can receive the digitalized radio broadcast. When the digitalized AM radio broadcast is received by the receiver, FM-quality sound is obtained. When the digitalized FM radio broadcast is received by the receiver, CD-quality sound is obtained.

FIG. 4 shows an example of spectrum of a FM radio wave in an IBOC system according to a related art. A pair of side bands is disposed on both sides of a carrier wave of the analog FM broadcast. Each side band occupies spectrum in a range between f1−198 kHz and f1−129 kHz or a range between f1+129 kHz and f1+198 kHz. Here, f1 represents a center frequency. The side band includes a sub-carrier wave generated by an orthogonal frequency division multiplex (i.e., OFDM) modulation method. Thus, the digital FM broadcast is performed. A signal level of the OFDM sub-carrier wave corresponding to the digital FM broadcast is set to be −25 dBμV with reference to a carrier wave corresponding to the conventional analog FM broadcast.

The radio receiver has automatic tuning function for searching or tuning a radio broadcast station automatically so that an audio signal from the station is clearly received. The FM radio station has a frequency clearance of, for example, 200 kHz, in US. Accordingly, a frequency step of the radio receiver is set to be 200 kHz when the radio receiver tunes the station.

However, the digital FM radio wave has a wide frequency range of 400 kHz, for example, as shown in FIG. 4. Thus, the analog radio receiver may fail to tune the station at a frequency next to the central frequency of the station by one step, i.e., by 200 kHz. Thus, the analog radio receiver may receive only noise even when tuning of the station is performed. Here, the analog radio receiver cannot demodulate and decode the digital signal.

JP-A-2004-312563 and JP-A-2005-191850 disclose a technique for automatically tuning a station when the analog broadcast and the digital broadcast are mixed. An automatic tuning device disclosed in JP-A-2004-312563 includes a means for canceling frequency information of a station, which is determined by the device that the device cannot output a normal audio signal, the frequency information detected by the receiver. Determination whether the device can output the normal audio signal is performed on the basis of current position information of the receiver and information of the station memorized in a memory. The information of the station is, for example, a channel of the station, an output power of the station, and a latitude and a longitude of the station. In this case, it is necessary to preliminarily memorize the information of the station in the memory, the station which is not preset by the device. Accordingly, it is necessary for the device to update the information when a new station increases in a region. Specifically, in a region at which the digital broadcast rapidly becomes common, the update of the information is necessary.

Further, the radio receiver disclosed in JP-A-2005-191850 searches the station with distinguishing the analog radio broadcast and the digital radio broadcast so that the receiver receives only the digital signal in the digital radio broadcast. In this case, the radio receiver receives both of the analog radio broadcast and the digital radio broadcast. Accordingly, it is impossible to apply the above technique to a conventional analog receiver having no detection circuit for the digital radio broadcast.

Thus, it is required for a radio broadcast receiver having no detection circuit for a digital radio broadcast signal to tune only an analog radio broadcast station with high accuracy. Further, it is required for an automatic tuning device for an analog radio broadcast station with high accuracy.

SUMMARY OF THE INVENTION

In view of the above-described problem, it is an object of the present disclosure to provide a radio broadcast receiver. It is another object of the present disclosure to provide an automatic tuning device for radio broadcast. It is further another object of the present disclosure to provide a method for receiving radio broadcast.

According to a first aspect of the present disclosure, a radio broadcast receiver includes: a frequency conversion circuit for receiving a radio broadcast wave and for outputting a reception signal having an intermediate frequency; a detection circuit for detecting the reception signal of an analog radio broadcast wave and for outputting a modulation signal as a detection signal in an audio range; an automatic tuning device for searching a broadcast frequency corresponding to a reception signal level of the reception signal by changing a reception signal frequency of the reception signal, the reception signal level being equal to or larger than a predetermined electric field intensity threshold value; and a noise amplifier for amplifying a noise component in the detection signal and for outputting a noise detection signal corresponding to a noise amount. The automatic tuning device controls the frequency conversion circuit to output the reception signal, which is converted to have the intermediate frequency from the broadcast frequency, and the automatic tuning device selects the broadcast frequency when the reception signal level is equal to or larger than the predetermined electric field intensity threshold value and a noise detection signal level of the noise detection signal is equal to or smaller than a predetermined noise determination threshold value.

In the above receiver, when the reception signal corresponding to the analog radio broadcast wave is inputted, the reception signal is properly detected, and the modulation signal in the audio range is outputted. However, when the reception signal corresponding to the digital radio broadcast wave is inputted, the reception signal is not properly detected, and the noise is outputted. The noise amplifier amplifies the noise component in the modulation signal, i.e., the detection signal, and then, the noise detection signal is outputted. This noise detection signal exceeds when the reception signal corresponding to the digital radio broadcast wave is inputted. Thus, the automatic tuning device tunes the analog radio broadcast wave only.

According to a second aspect of the present disclosure, an automatic tuning device is provided for searching a broadcast frequency corresponding to a reception signal level of a reception signal by changing a reception signal frequency of the reception signal, the reception signal level being equal to or larger than a predetermined electric field intensity threshold value. The reception signal is outputted from a radio broadcast receiver having a frequency conversion circuit and a detection circuit. The frequency conversion circuit receives a radio broadcast wave and outputs the reception signal having an intermediate frequency, and the detection circuit detects the reception signal of an analog radio broadcast wave and outputs a modulation signal as a detection signal in an audio range. The device includes: a noise amplifier for amplifying a noise component in the detection signal and for outputting a noise detection signal corresponding to a noise amount; and a controller. The controller controls the frequency conversion circuit to output the reception signal, which is converted to have the intermediate frequency from the broadcast frequency. The controller selects the broadcast frequency when the reception signal level is equal to or larger than the predetermined electric field intensity threshold value and a noise detection signal level of the noise detection signal is equal to or smaller than a predetermined noise determination threshold value.

The above device correctly tunes the analog radio broadcast wave only.

According to a third aspect of the present disclosure, a method for receiving radio broadcast includes: receiving a radio broadcast wave, converting the radio broadcast wave to have an intermediate frequency from a broadcast frequency of the radio broadcast wave, and outputting the converted radio broadcast wave as a reception signal having the intermediate frequency; detecting the reception signal of an analog radio broadcast wave and outputting a modulation signal as a detection signal in an audio range; searching the broadcast frequency corresponding to a reception signal level of the reception signal by changing a reception signal frequency of the reception signal, the reception signal level being equal to or larger than a predetermined electric field intensity threshold value; and amplifying a noise component in the detection signal and outputting a noise detection signal corresponding to a noise amount. The searching includes selecting the broadcast frequency when the reception signal level is equal to or larger than the predetermined electric field intensity threshold value and a noise detection signal level of the noise detection signal is equal to or smaller than a predetermined noise determination threshold value.

The above method provides to correctly tune the analog radio broadcast wave only.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

Figure 1:
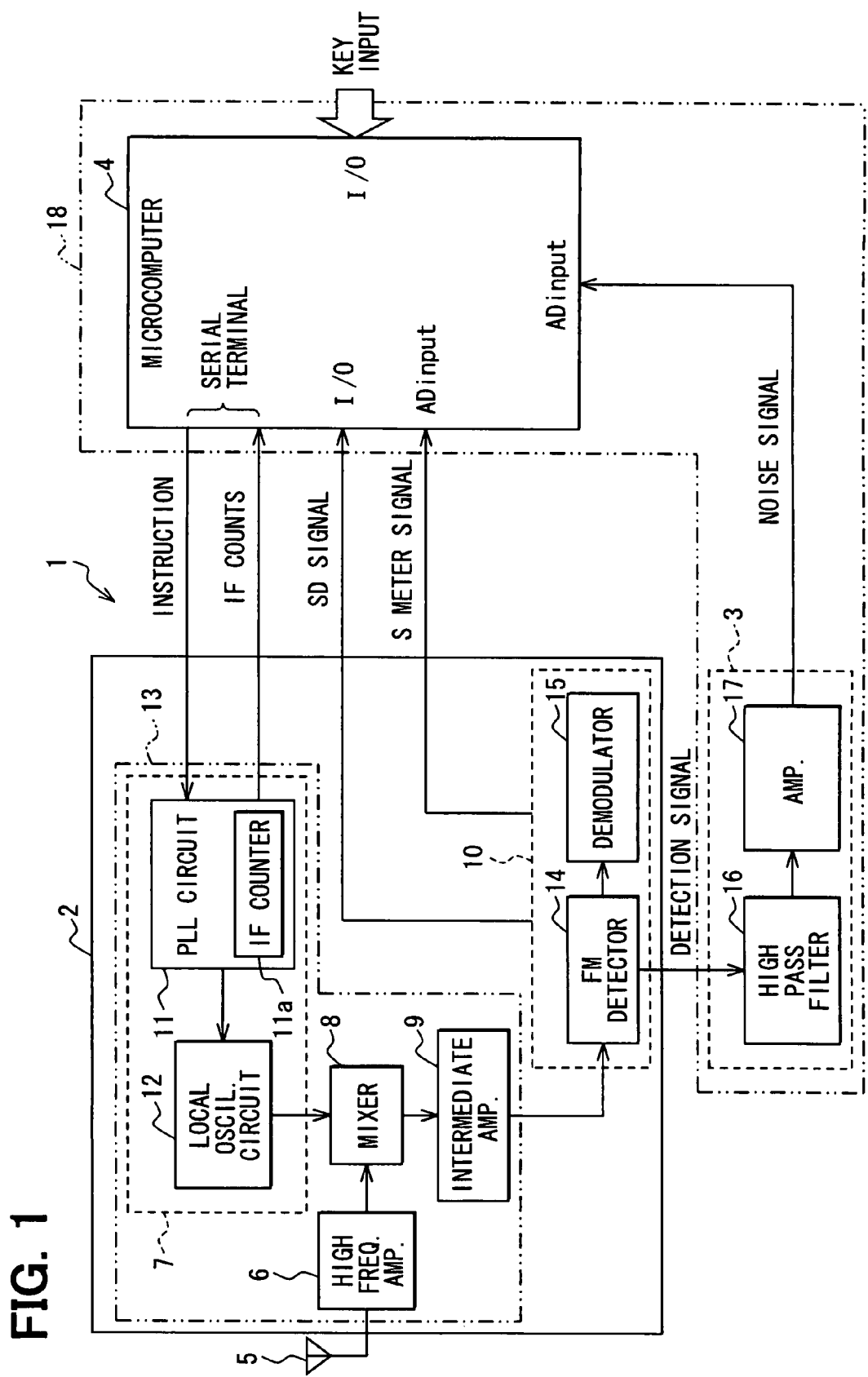
FIG. 1 is a block diagram showing a radio receiver.

FIG. 1 shows a radio receiver 1 for receiving analog FM radio broadcast. The receiver 1 as a radio broadcast receiving device has automatic tuning function for tuning only an analog FM radio station accurately not only in a region in which only analog radio broadcast is performed, but also in a region in which both of analog radio broadcast and digital radio broadcast are performed.

The radio receiver 1 includes an analog tuner 2, a noise amplifier 3 and a micro computer 4. The analog tuner 2 includes a high frequency amplifier circuit 6 connecting to an antenna 5, a local oscillator 7, a mixer 8, an intermediate amplifier circuit 9 and a FM demodulator 10.

The local oscillator 7 includes a PLL circuit 11 and a local oscillation circuit 12. The local oscillator 7 generates a local oscillation signal in accordance with an instruction signal of a local oscillation frequency. The instruction signal is inputted from the micro computer 4. Further, the local oscillator 7 outputs the local oscillation to the mixer 8. The PLL circuit 11 includes an IF counter 11a. When an IF count start instruction is inputted, the counter 11a counts the number of pulses having an intermediate frequency. The IF count value is outputted to the micro computer 4. The mixer 8 mixes a reception signal outputted from the high frequency amplifier circuit 6 and the local oscillation signal, and outputs the reception signal having a predetermined intermediate frequency. The high frequency amplifier circuit 6, the local oscillator 7, the mixer 8 and the intermediate amplifier circuit 9 provide a frequency converter circuit 13.

The FM demodulator 10 includes a FM detection circuit 14 and a stereo demodulation circuit 15. The FM detection circuit 14 detects the reception signal with FM detection method when the reception signal corresponding to analog radio broadcast is inputted from the frequency converter circuit 13. Then, the FM detection circuit 14 outputs a modulation signal having an audio range as a detection signal. When the reception signal corresponding to digital FM radio broadcast is inputted from the frequency converter circuit 13, the FM detection circuit 14 does not detect the reception signal correctly. Therefore, the detection signal composed of noise is outputted. The stereo demodulation circuit 15 demodulates the detection signal so that a stereo sound is demodulated. The stereo sound is outputted from a speaker (not shown).

The FM demodulator 10 outputs a S meter signal and a SD signal. The S meter signal shows electric field intensity of the reception signal, i.e., magnitude of the reception signal. The SD signal is a binary signal such that the SD signal shows a high level when the magnitude of reception signal exceeds a predetermined threshold value. The threshold value for generating the SD signal is an index level for determining existence of a radio station in case of automatic tuning. For example, the threshold value corresponds to the electric field intensity of 50 dBµV The noise amplifier 3 includes a high pass filter 16 and an amplifier circuit 17.

The high pass filter 16 has a cutoff frequency higher than the audio range. The amplifier circuit 17 is arranged at a latter step. The noise amplifier 3 amplifies a noise component in the detection signal outputted from the FM detection circuit 14. Then, the noise amplifier 3 outputs a noise detection signal corresponding to a noise level.

The micro computer 4 includes a CPU, a RAM, a ROM, an A/D converter, an I/O port, a serial communication circuit and the like. The micro computer 4 transmits an instruction signal of local oscillation frequency and an IF count start instruction signal to the local oscillator 7 with a serial communication method. Further, the micro computer 4 receives an IF count value signal from the local oscillator 7 with the serial communication method. Furthermore, the SD signal is inputted into the micro computer 4 from the FM demodulator 10 through the I/O port. The S meter signal outputted from the FM demodulator 10 and the noise detection signal outputted from the noise amplifier 3 are A/D converted by the micro computer 4 and inputted into the micro computer 4. The micro computer 4 and the noise amplifier 3 provide an automatic tuning device 18 as an automatic tuning means.

In FIG. 1, an operation portion as a key input portion includes an up key, a down key, multiple preset keys, and an automatic preset key. The micro computer 4 performs automatic tuning operation in accordance with an operation signal inputted from the operation portion. For example, when the up key is operated, the micro computer 4 performs an automatic tuning program memorized in the ROM so that the micro computer 4 starts to search an analog FM radio station having a high reception signal level at a frequency higher than a frequency of a current FM radio station, which is received currently. Thus, the reception signal electric field intensity of the searched FM radio station is high.

When the automatic preset key is operated, the micro computer 4 performs the automatic tuning program in the ROM so that the micro computer 4 sequentially searches analog FM radio broadcast stations having a high reception signal level in a whole frequency range of the FM radio broadcast. The frequency of each searched station is assigned to, i.e., memorized in a corresponding preset key.

Figure 2:
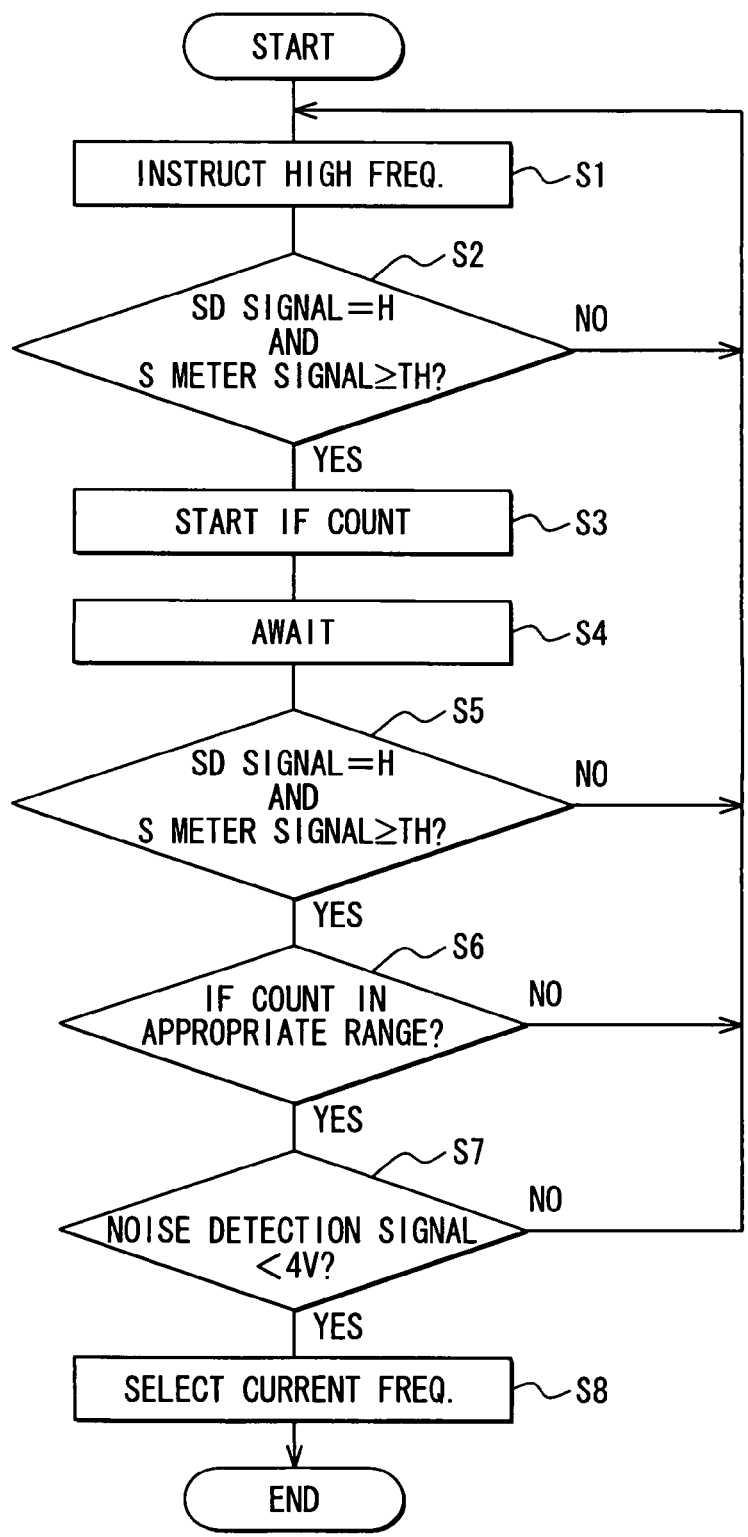
FIG. 2 is a flow chart showing an automatic tuning program in case of an up key operation.

FIG. 2 shows a flow chart of the automatic tuning program, which is performed by the micro computer 4 when the up key is operated. In Step S1, the micro computer 4 transmits the instruction signal of the local oscillation frequency to the local oscillator 7, the local oscillation frequency corresponding to a reception signal frequency, which is one step higher than the current reception signal frequency. Each FM radio station has a frequency allocation of 200 kHz in US. The one step is equal to the frequency allocation of 200 kHz.

In Step S2, the micro computer 4 determines whether the reception signal level is equal to or larger than a predetermined electric field intensity threshold value, at which the sound is audible sufficiently. Specifically, the micro computer 4 determines that the SD signal from the FM demodulator 10 is in a high level, and further, the S meter signal is equal to or larger than a predetermined threshold value TH. Here, when the micro computer 4 determines that determination condition is not satisfied, there is no station or the electric field of the radio wave from the station is low. Thus, the micro computer 4 determines "NO," and it returns to Step S1.

When the computer 4 determines that the determination condition is satisfied, the computer 4 determines "YES," and it goes to Step S3. The micro computer 4 outputs the IF count start instruction signal to the local oscillator 7. The IF counter 11a counts the number of pulses having the intermediate frequency during a predetermined count time, for example, 10 milli-seconds. In Step S4, the micro computer 4 awaits for the count time. In Step S5, the micro computer 4 determines that the reception signal level satisfies the determination condition, which is the same as Step S2. Specifically, the micro computer 4 determines that the SD signal is in the high level, and the S meter signal is equal to or larger than the predetermined threshold value TH. In Step S6, the micro computer 4 determines whether the IF count value received from the local oscillator 7 is in an appropriate range. In Step S5 or S6, when the condition is not satisfied, the micro computer 4 determines "NO," and it returns to Step S1.

When both conditions in Steps S5 and S6 are satisfied, it goes to Step S7. In Step S7, the micro computer 4 determines whether the noise detection signal A/D converted at and inputted from the noise amplifier 3 is equal to or smaller than a predetermined noise threshold value. In the present embodiment, the noise threshold value is four volts. The determination step in Step S7 provides to search only the analog FM radio broadcast in a case where the digital FM radio broadcast and the analog FM radio broadcast are mixed.

Figure 3:
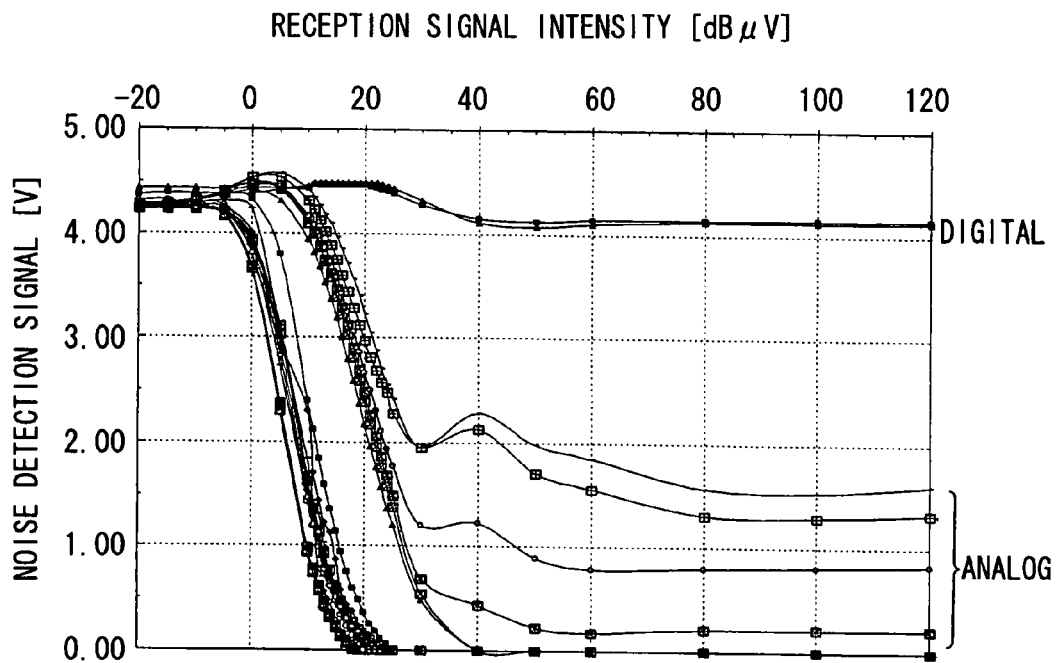
FIG. 3 is a graph showing a relationship between a noise detection signal and a reception signal electric field intensity.
Figure 4:
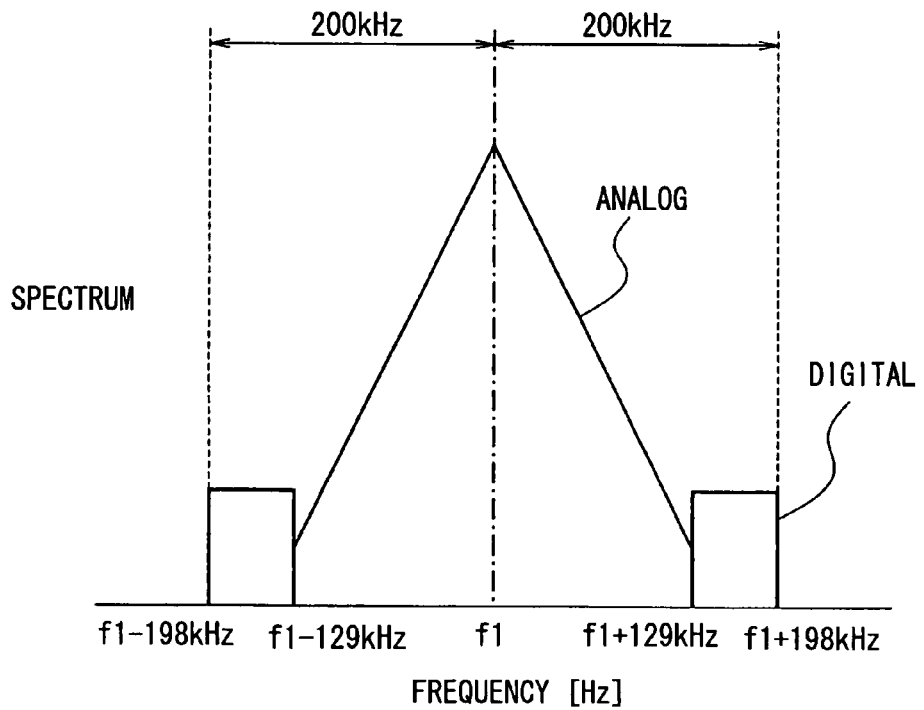
FIG. 4 is a chart showing a spectrum of a FM radio wave in an IBOC system.

The FM broadcast wave having the IBOC system is provided in such a manner that side bands as the digital FM radio broadcast carrier wave are added on both sides of the analog FM radio broadcast carrier wave, as shown in FIG. 4. Thus, the radio receiver 1 can detect and regenerate the analog radio broadcast wave having the center frequency of f1. Here, the electric field intensity of a OFDM sub-carrier wave on each side band is set to be about −25 dBµV with respect to the electric field intensity of the analog radio broadcast carrier wave. Thus, the OFDM sub-carrier wave may satisfy the detection conditions in Steps S2, S5 and S6 although the OFDM sub-carrier wave cannot be detected and regenerated. Thus, the micro computer 4 distinguishes the analog radio broadcast wave from the digital radio broadcast wave on the basis of the noise detection signal outputted from the noise amplifier 3. FIG. 3 shows a relationship between the reception signal electric field intensity of the FM radio broadcast wave and the noise detection signal from the noise amplifier 3. Multiple characteristic lines in each of the digital radio broadcast and the analog radio broadcast have different frequencies of the audio signal as a modulation signal.

The FM detection circuit 14 cannot detect the digital radio broadcast wave. Thus, the detection signal includes only the noise component. Accordingly, the noise detection signal has a level higher than four volts without depending on the reception signal electric field intensity in a case where the digital radio broadcast wave is received. However, the FM detection circuit 14 detects the analog radio broadcast wave, and outputs the detection signal in the audio range. Thus, since the high pass filter 16 cuts off the low frequency range signal, the noise detection signal is smaller than four volts when the analog radio broadcast wave is received. Accordingly, the noise determination value, i.e., the noise threshold value is set to be four volts.

As the reception signal electric field intensity of the FM radio broadcast wave becomes smaller, the noise of the detection signal of the analog radio broadcast wave in a high frequency range becomes larger. In FIG. 3, when the electric field intensity threshold value of the S meter signal is equal to or larger than 30 dBµV, the analog radio broadcast wave is accurately separated from the digital radio broadcast wave.

Preferably, the electric field intensity threshold value of the S meter signal may be equal to or larger than 50 dBµV.

In Step S7, when the micro computer 4 determines that the noise detection signal is smaller than four volts, the micro computer determines "YES," and it goes to Step S8. In Step S8, the current reception frequency is selected as the analog FM radio broadcast frequency. Then, the search ends. When the micro computer 4 determines that the noise detection signal is equal to or larger than four volts, the micro computer determines "NO," and it returns to Step S1. This is because the current reception frequency is the digital FM radio broadcast frequency. Thus, the search continues with regard to a frequency, which is one step higher than the current frequency. When the down key or the automatic preset key is operated, similar automatic tuning process is performed.

Thus, the radio receiver 1 includes the analog tuner 2 capable of detecting the analog FM radio broadcast wave and the automatic tuning device 18 composed of the noise amplifier 3 and the micro computer 4. The detection signal is inputted into the automatic tuning device 18. When the digital radio broadcast wave is received, the level of the noise detection signal outputted from the noise amplifier 3 is always equal to or larger than the noise detection level, i.e., four volts. Thus, the micro computer 4 correctly and automatically tunes only the analog FM radio broadcast station on the basis of comparison between the noise detection signal and the noise determination threshold value.

In this case, the tuning condition includes that the reception signal electric field intensity is equal to or larger than a predetermined threshold value. Therefore, the micro computer 4 does not select a FM radio station, of which the electric field intensity is extremely small so that it is difficult to listen to the sound. Accordingly, the micro computer 4 can avoid a case where the micro computer 4 cannot determine the analog radio broadcast because the reception signal electric field intensity is extremely reduced and the noise detection signal becomes much larger.

Since the high pass filter 16 in the noise amplifier 3 has the cutoff frequency higher than the audio range, the modulation signal in the audio range of the analog FM radio broadcast is cut off, the analog radio broadcast being correctly detected. Thus, the noise amplifier 3 amplifies only the noise component in the detection signal, so that the noise detection signal reflecting the noise amount correctly is outputted.

Although the radio receiver 1 receives the FM radio broadcast station, the receiver 1 may receive an AM radio broadcast station. Although the receiver 1 receives the FM radio wave in the IBOC system, the receiver 1 may receive a FM radio wave in anther system such as a DAB (i.e., digital audio broadcast) system.

While the invention has been described with reference to preferred embodiments thereof, it is to be understood that the invention is not limited to the preferred embodiments and constructions. The invention is intended to cover various modification and equivalent arrangements. In addition, while the various combinations and configurations, which are preferred, other combinations and configurations, including more, less or only a single element, are also within the spirit and scope of the invention.

What is claimed is:

1. A radio broadcast receiver for analog broadcasting, comprising:
a frequency conversion circuit for receiving an analog radio broadcast wave and for outputting a reception signal having an intermediate frequency;
a detection circuit for detecting the reception signal of the analog radio broadcast wave and for outputting a modulation signal as a detection signal in an audio range;
an automatic tuning device for searching a broadcast frequency corresponding to a reception signal level of the reception signal by changing a reception signal frequency of the reception signal, the reception signal level being equal to or larger than a predetermined electric field intensity threshold value; and
a noise amplifier for amplifying a noise component in the detection signal and for outputting a noise detection signal corresponding to a noise amount, wherein
the noise component corresponds to a digital radio broadcast wave having a frequency adjacent to the broadcast frequency of the analog radio broadcast wave,
the automatic tuning device controls the frequency conversion circuit to output the reception signal, which is converted to have the intermediate frequency from the broadcast frequency,
the automatic tuning device selects the broadcast frequency of the analog radio broadcast wave when the reception signal level is equal to or larger than the predetermined electric field intensity threshold value and a noise detection signal level of the noise detection signal is equal to or smaller than a predetermined noise determination threshold value, and
the predetermined noise determination threshold value is preliminarily set with respect to the digital radio broadcast wave.

2. The receiver according to claim 1, wherein
the noise amplifier includes a high pass filter and an amplifier,
the high pass filter has a cutoff frequency higher than the audio range, and
the amplifier is arranged on a latter step of the high pass filter.

3. The receiver according to claim 1, wherein
the receiver is disposed in a region, in which a digital radio broadcast wave and the analog radio broadcast wave are mixed in a common frequency range.

4. The receiver according to claim 1, wherein
the predetermined electric field intensity threshold value is 30 dBµV, and
the predetermined noise determination threshold value is four volts.

5. The receiver according to claim 4, wherein
the predetermined electric field intensity threshold value is 50 dBµV.

6. The receiver according to claim 4, wherein
the noise amplifier includes a high pass filter and an amplifier,
the high pass filter has a cutoff frequency higher than the audio range,
the amplifier is arranged on a latter step of the high pass filter,
the frequency conversion circuit includes a mixer and a local oscillator,
the local oscillator generates a local oscillation signal, and
the mixer mixes the radio broadcast wave and the local oscillation signal so that the reception signal is provided.

7. The receiver according to claim 6, wherein
the local oscillator includes a PLL circuit having an IF counter and a local oscillation circuit,
the IF counter counts a number of pulses corresponding to the intermediate frequency,
the IF counter outputs a signal of the number of pulses as an IF count value into the automatic tuning device, the local oscillation circuit generates and outputs the local oscillation signal to the mixer, and the automatic tuning device selects the broadcast frequency when the IF count value is in a predetermined range.

8. An automatic tuning device of analog broadcasting for searching a broadcast frequency corresponding to a reception signal level of a reception signal by changing a reception signal frequency of the reception signal, the reception signal level being equal to or larger than a predetermined electric field intensity threshold value, wherein the reception signal is outputted from a radio broadcast receiver having a frequency conversion circuit and a detection circuit, wherein the frequency conversion circuit receives an analog radio broadcast wave and outputs the reception signal having an intermediate frequency, and wherein the detection circuit detects the reception signal of the analog radio broadcast wave and outputs a modulation signal as a detection signal in an audio range, the device comprising:

a noise amplifier for amplifying a noise component in the detection signal and for outputting a noise detection signal corresponding to a noise amount; and a controller, wherein the noise component corresponds to a digital radio broadcast wave having a frequency adjacent to the broadcast frequency of the analog radio broadcast wave, the controller controls the frequency conversion circuit to output the reception signal, which is converted to have the intermediate frequency from the broadcast frequency, the controller selects the broadcast frequency of the analog radio broadcast wave when the reception signal level is equal to or larger than the predetermined electric field intensity threshold value and a noise detection signal level of the noise detection signal is equal to or smaller than a predetermined noise determination threshold value, and the predetermined noise determination threshold value is preliminarily set with respect to the digital radio broadcast wave.

9. The device according to claim 8, wherein
the noise amplifier includes a high pass filter and an amplifier,
the high pass filter has a cutoff frequency higher than the audio range, and
the amplifier is arranged on a latter step of the high pass filter.

10. The device according to claim 8, wherein
the receiver is disposed in a region, in which a digital radio broadcast wave and the analog radio broadcast wave are mixed in a common frequency range.

11. The device according to claim 8, wherein
the predetermined electric field intensity threshold value is 30 dBµV, and
the predetermined noise determination threshold value is four volts.

12. The device according to claim 11, wherein
the predetermined electric field intensity threshold value is 50 dBµV.

13. The device according to claim 11, wherein
the noise amplifier includes a high pass filter and an amplifier,
the high pass filter has a cutoff frequency higher than the audio range,
the amplifier is arranged on a latter step of the high pass filter,
the frequency conversion circuit includes a mixer and a local oscillator,
the local oscillator generates a local oscillation signal, and
the mixer mixes the radio broadcast wave and the local oscillation signal so that the reception signal is provided.

14. The device according to claim 13, wherein
the local oscillator includes a PLL circuit having an IF counter and a local oscillation circuit,
the IF counter counts a number of pulses corresponding to the intermediate frequency,
the IF counter outputs a signal of the number of pulses as an IF count value into the automatic tuning device,
the local oscillation circuit generates and outputs the local oscillation signal to the mixer, and
the controller selects the broadcast frequency when the IF count value is in a predetermined range.

15. A method for receiving analog radio broadcast comprising:

receiving an analog radio broadcast wave, converting the analog radio broadcast wave to have an intermediate frequency from a broadcast frequency of the analog radio broadcast wave, and outputting the converted radio broadcast wave as a reception signal having the intermediate frequency;

detecting the reception signal of the analog radio broadcast wave and outputting a modulation signal as a detection signal in an audio range;

searching the broadcast frequency corresponding to a reception signal level of the reception signal by changing a reception signal frequency of the reception signal, the reception signal level being equal to or larger than a predetermined electric field intensity threshold value; and amplifying a noise component in the detection signal and outputting a noise detection signal corresponding to a noise amount, wherein the noise component corresponds to a digital radio broadcast wave having a frequency adjacent to the broadcast frequency of the analog radio broadcast wave, the searching includes selecting the broadcast frequency of the analog radio broadcast wave when the reception signal level is equal to or larger than the predetermined electric field intensity threshold value and a noise detection signal level of the noise detection signal is equal to or smaller than a predetermined noise determination threshold value, and the predetermined noise determination threshold value is preliminarily set with respect to the digital radio broadcast wave.

* * * * *